(12) United States Patent  
Bill et al.

(10) Patent No.: US 7,474,579 B2  
(45) Date of Patent: Jan. 6, 2009

(54) USE OF PERIODIC REFRESH IN MEDIUM RETENTION MEMORY ARRAYS

(75) Inventors: Colin S. Bill, Cupertino, CA (US); Swaroop Kaza, Woburn, MA (US); Wei Daisy Cai, Fremont, CA (US); Tzu-Ning Fang, Palo Alto, CA (US); David Gaun, Brookline, MA (US); Eugen Gershon, San Jose, CA (US); Michael A. Van Buskirk, Saratoga, CA (US); Jean Wu, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 34 days.

(21) Appl. No.: 11/613,832

(22) Filed: Dec. 20, 2006

(65) Prior Publication Data

US 2008/0151669 A1      Jun. 26, 2008

(51) Int. Cl.  
    *G11C 7/00*     (2006.01)
(52) U.S. Cl. .................... 365/222; 365/189.07; 365/148
(58) Field of Classification Search .................. 365/222, 365/189.07, 148  
See application file for complete search history.

(56) References Cited

U.S. PATENT DOCUMENTS

| 5,278,797 | A  | * | 1/1994  | Jeon et al. ................... 365/222 |
| 6,992,942 | B2 | * | 1/2006  | Ito ............................... 365/222 |
| 7,259,983 | B2 | * | 8/2007  | Bill et al. .................... 365/163 |
| 2006/0158948 | A1 | * | 7/2006 | Fuji ............................ 365/222 |
| 2006/0265548 | A1 | * | 11/2006 | Symanczyk et al. ......... 711/106 |

* cited by examiner

Primary Examiner—Connie C Yoha  
(74) Attorney, Agent, or Firm—Amin, Turocy & Calvin, LLP

(57) ABSTRACT

Systems and methods are disclosed that facilitate extending data retention time in a data retention device, such as a nanoscale resistive memory cell array, via assessing a resistance level in a tracking element associated with the memory array and refreshing the memory array upon a determination that the resistance of the tracking element has reached or exceeded a predetermined reference threshold resistance value. The tracking element can be a memory cell within the array itself and can have an initial resistance value that is substantially higher than an initial resistance value for a programmed memory cell in the array, such that resistance increase in the tracking cell will cause the tracking cell to reach the threshold value and trigger refresh of the array before data corruption/loss occurs in the core memory cells.

20 Claims, 11 Drawing Sheets

USE OF PERIODIC REFRESH IN MEDIUM RETENTION MEMORY ARRAYS

TECHNICAL FIELD

The present invention relates generally to memory cell arrays, and more particularly to systems and methodologies that facilitate increasing retention of memory arrays via periodic refreshing thereof.

BACKGROUND OF THE INVENTION

The proliferation and increased usage of portable computer and electronic devices has greatly increased demand for memory cells. Digital cameras, digital audio players, personal digital assistants, and the like generally seek to employ large capacity memory cells (e.g., flash memory, smart media, compact flash, or the like). Memory cells can be typically employed in various types of storage devices. Storage devices include long term storage mediums such as, for example, hard disk drives, compact disk drives and corresponding media, digital video disk (DVD) drives, and the like. The long-term storage mediums typically store larger amounts of information at a lower cost, but are slower than other types of storage devices. Storage devices also include memory devices, which are often, but not always, short-term storage mediums.

Because of the increasing demand for information storage, memory device developers and manufacturers are constantly attempting to increase speed and storage retrieval for memory devices (e.g. increase write/read speed). At the same time, to reach high storage densities, manufacturers typically focus on scaling down semiconductor device dimensions (e.g., at submicron levels). Nonetheless, formation of various transistor type control devices that are typically required for programming memory cell arrays increase costs and reduce efficiency of circuit design. Additionally, memory cell retention can often be limited by constraints placed on memory cell density and/or speed.

Therefore, a need exists in the art for systems and methods that surmount the aforementioned deficiencies associated with conventional devices.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides for systems and methods that facilitate increasing retention time for relatively short-term data retention devices. For example, with regard to medium-length data retention memory, retention time can be extended almost indefinitely via refresh. When power is removed from, for instance, a non-volatile memory device, the present systems and/or methods can facilitate scheduling refreshes of such memory devices in order to mitigate data loss and/or corruption. In order to facilitate such scheduling of refreshes, the present invention provides a tracking element that is capable of shifting and/or changing states without power applied thereto.

According to an aspect of the invention, a tracking cell can be provided and monitored to facilitate determinations of whether and/or when to refresh a memory cell array, such as a nanoscale resistive memory (NRM) array, comprising the tracking cell. A simple read circuit can read the tracking cell and compare a voltage associated therewith to a reference voltage in order to determine whether refresh is necessary. The state of the tracking cell can be assessed during each power-up of the memory device and/or periodically during continuous power-up. If the tracking cell indicates at the time of power-up that charge loss has occurred beyond a predetermined acceptable threshold, then the whole memory cell array can be refreshed. Additionally, if the tracking cell indicates that an acute loss of charge has occurred (e.g. due to the device being powered off for an excessive time period), then such indication can be employed by the system to facilitate presenting an accurate indication of lost and/or corrupted data to a user. Typical cells in an NRM array exhibit a data retention period that is inversely proportional to the initial resistive state of the cell. Accordingly, the data retention period of a cell depends on the initial resistive state of the cell. The tracking cell for a given array can be set to an initial resistive state in excess of the highest initial resistance for a memory cell. The tracking cell can then have its resistance increased with respect to time at a rate that is substantially and/or precisely similar to the rate of resistance increase for the memory cells. Moreover, the resistance of the tracking cell can increase regardless of whether power is applied to the memory cell array, permitting the tracking cell to provide accurate information related to whether refresh is necessary after power-down periods. Such can be achieved because ion (e.g., copper ions, . . . ) can continue during power-down periods, which can increase resistance in the cells. When power is again applied to the array (e.g., during a power-up phase), the resistance of the tracking cell can be compared to the predetermined reference resistance value to determine whether refresh is necessary. Additionally, the tracking cell can be monitored periodically and/or continuously during periods in which power is applied to the array and can refresh as necessary to minimize power consumption by the array by mitigating unnecessary refresh.

According to a related aspect of the subject invention, tracking cell can be provided for each page of memory cells, such that, if desired, one wordline per memory array can be devoted to tracking cells. Upon reading a data page, the tracking cell can be assessed prior to reading of core memory cells in the array. If it is determined that the resistance of the tracking cell for the data page has increased to a value equal to or greater than a predetermined acceptable threshold value, then the entire data page can be refreshed. Refreshing an array can comprise resetting programmed cells to initial (e.g., lower) resistance values and/or re-erasing erased cells (e.g., resetting erased cells to high resistance states).

According to another aspect of the present invention, a capacitor structure with variable capacitance can be provided that is constructed and/or designed to lose charge at a rate approximating a rate at which typical memory cells in a memory cell array lose charge. The capacitor structure can be constructed utilizing materials similar to those employed in construction of the memory cell(s). In this manner, the system can facilitate an accurate determination of an appropriate time for refreshing a memory cell array in order to mitigate occurrences of lost and/or corrupted data and to extend duration of data retention by the memory device.

To the accomplishment of the foregoing and related ends, certain illustrative aspects of the invention are described herein in connection with the following description and the annexed drawings. These aspects are indicative, however, of but a few of the various ways in which the principles of the invention can be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

Figure 1:
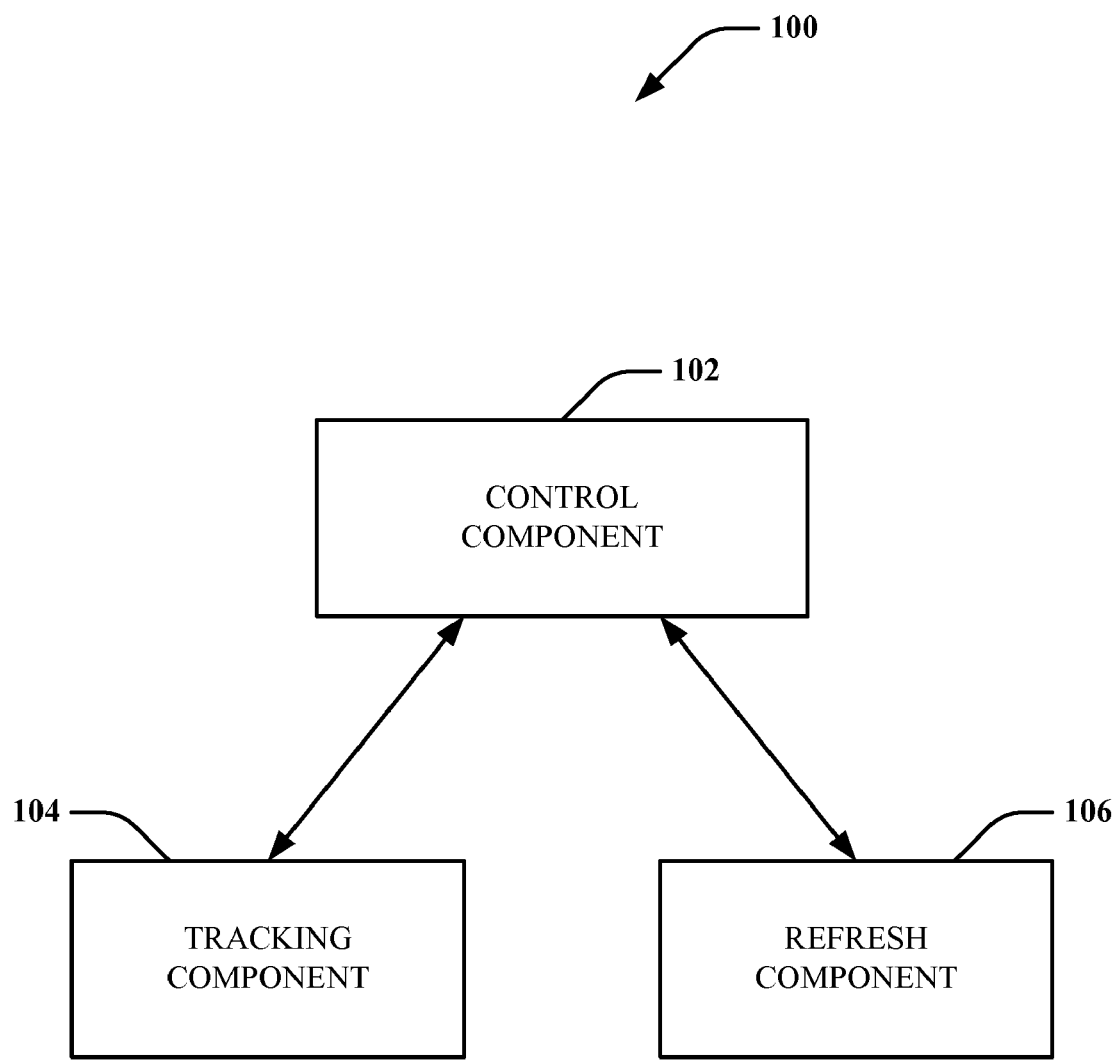
FIG. 1 is an illustration of a system 100 that facilitates extending the duration of data retention in a nanoscale resistive memory array according to an aspect of the subject invention.

The present invention will now be described with reference to the drawings, wherein like reference numerals are used to refer to like elements throughout. The present invention will be described with reference to systems and methods for extending polymer memory retention time potentially indefinitely via memory refresh. It should be understood that the description of these exemplary aspects are merely illustrative and that they should not be taken in a limiting sense.

The term "component" refers to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network).

The term "tracking cell" refers to a memory cell in an array wherein the tracking cell is set to a higher initial resistance level than core memory cells and is assessed to determine whether the core memory cells require refreshing. "Tracking cell" as used herein is synonymous with "reference cell," "tracking element," "reference element," and the like.

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function link networks) can be employed.

FIG. 1 is an illustration of a system 100 that facilitates extending the duration of data retention in a memory array according to an aspect of the subject invention. A control component 102 is operatively coupled to a tracking component 104 and a refresh component 106. The control component 102 can receive information from the tracking component regarding, for example, status of a tracking element in a memory cell array, such as a nanoscale resistive memory (NRM) array, etc. The tracking component 104 can monitor a specific tracking memory cell to determine a resistance thereof. The tracking cell can be designed with a resistance that increases at a known rate regardless of whether power is applied to the system 100 and/or a memory array associate with the tracking cell. Such can be achieved because ionic movement in the tracking cell occurs even during power-down periods, thereby causing an increase in resistance in the tracking cell. When power is again applied to the memory array associated with the tracking cell, the tracking component 104 can assess the state of the tracking cell and compare a resistance thereof to a predetermined acceptable threshold value. The control component 102 can receive information related to such resistance status and can make a determination regarding whether, for example, memory cells in the memory cell array require refreshing in order to maintain information in the memory cell array. For instance, if the resistance of the tracking cell is equal to or greater than the predetermined threshold value, the control component 102 can direct the refresh component 106 to refresh the memory cell array associated with the tracking cell. Refresh of the memory array can comprise, for example, resetting core memory cells to an original resistance level.

Memory cells can generally be subdivided into volatile and non-volatile types. Volatile memory cells usually lose their information if they lose power and typically require periodic refresh cycles to maintain their information. Volatile memory cells include, for example, random access memory (RAM), DRAM, SRAM and the like. Non-volatile memory cells maintain their information whether or not power is maintained to the devices. Examples of non-volatile memory cells include; ROM, programmable read only memory (PROM), erasable programmable read only memory (EPROM), electrically erasable programmable read only memory (EEPROM), flash EEPROM the like. Volatile memory cells generally provide faster operation at a lower cost as compared to non-volatile memory cells. Nonetheless, to retain the information, the stored data typically must be refreshed; that is, each capacitor must be periodically charged or discharged to maintain the capacitor's charged or discharged state. The maximum time allowable between refresh operations depends on the charge storage capabilities of the capacitors that make up the memory cells in the array. The memory device manufacturer typically specifies a refresh time that guarantees data retention in the memory cells.

As such, each memory cell in a memory device can be accessed or "read", "written", and "erased" with information. The memory cells typically maintain information in an "off" or an "on" state (e.g., are limited to 2 states), also referred to as "0" and "1". Typically, a memory device is addressed to retrieve a specified number of byte(s) (e.g., 8 memory cells, or bits, per byte). For volatile memory devices, the memory cells must be periodically "refreshed" in order to maintain their state. Such memory devices can be fabricated from semiconductor devices that perform these various functions and are capable of switching and/or maintaining the two states.

The system 100 can be particularly advantageous when applied to polymer memory cells, which typically have relatively short-term data retention. Similarly, dynamic random access memory (DRAM) is another example of a type of memory that requires frequent refreshing in order to compensate for a relatively short retention period, which can be mitigated by this and other aspects of the present invention.

According to another example, the system 100 can be employed to facilitate memory retention in a non-volatile memory array. Non-volatile memory can require refreshing after power to a memory array has been removed. The tracking component 104 can monitor, for instance, a particular memory cell in a nonvolatile memory array after power to the array has been removed. The control component can receive continuous (and/or periodic, intermittent, etc.) information regarding the state of the monitored memory cell (e.g., voltage level, charge in the cell, etc.) and can thereby determine when the status of the monitored memory cell falls below a predetermined threshold (e.g. a minimum predetermined voltage at which the memory cell must be refreshed to prevent data loss, etc.). The state of the monitored memory cell can be assessed during each power-up of the memory array and/or can be assessed periodically during a continuous power-up. When the state of the monitored memory cell as determined during power-up warrants refreshing of the cell, the control component 102 can direct the refresh component 106 to refresh all memory cells in the memory array. In this manner, a medium-length data retention memory device, such as non-volatile memory, can have its retention period extended potentially indefinitely.

Figure 2:
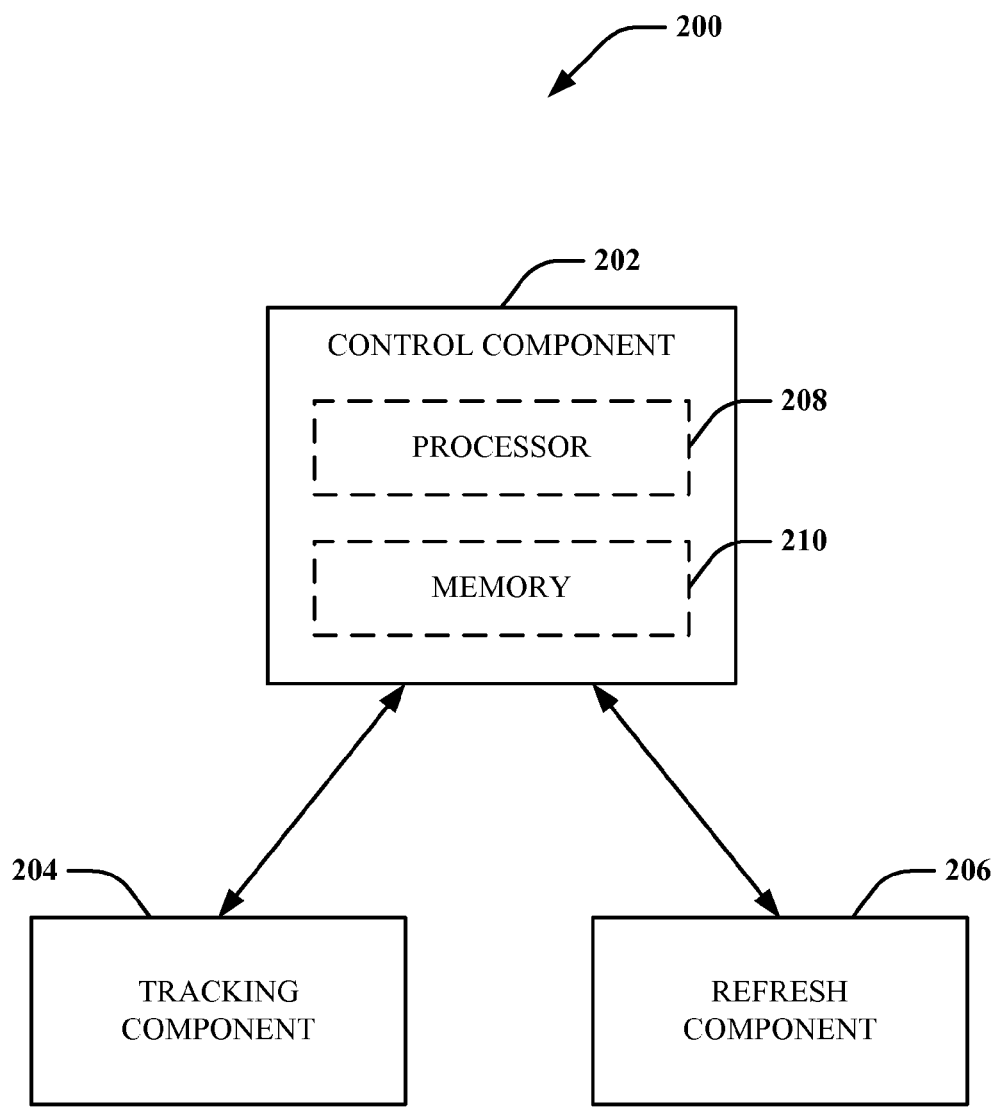
FIG. 2 is an illustration of a system 200 that facilitates extending retention time in a memory device in accordance with an aspect of the subject invention.

FIG. 2 is an illustration of a system 200 that facilitates extending retention time in a memory device in accordance with an aspect of the subject invention. A control component 202 is operatively coupled to, and can receive information from, a tracking component 204. The tracking component 204 can monitor a tracking cell within, for example, an NRM array, and can provide information related thereto to the control component 202. For instance, the tracking component 204 can assess a resistance of the tracking cell, voltage across the tracking cell, etc. If information received from the tracking component 204 indicates that resistance in the tracking memory cell is at or above a predetermined acceptable threshold level, the control component 202 can direct a refresh component 206 to refresh the entire memory array in order to mitigate potential loss of data stored in the array. In this manner, the control component 202 can facilitate determining whether an array in a memory device requires refreshing and can direct the refresh component 206 to refresh the memory device as necessary, without initiating unnecessary refresh instances such as can occur when employing a predetermined refresh interval.

According to an example, the system 200 facilitates refreshing a memory cell array, such as an NRM array, when refreshing is needed to prevent data loss/corruption and without performing unnecessary refreshes. Traditional memory refresh systems refresh memory arrays on a predetermined schedule that can be dictated by known attributes of a memory cell. For instance, if it is known that a particular type of memory requires refreshing every hour, then a conventional system can pre-schedule memory refreshes every 50 minutes. However, if the memory array does not require refreshing at the prescheduled time, then system resources (e.g., time, power . . . ) can be inefficiently expended to unnecessarily refresh the array. By mitigating a need for periodic refresh that is bound by prescheduled limitations, the system 200 improves device efficiency and reduces operating costs by facilitating operating a memory chip at a lowest possible level of power consumption. Furthermore, mitigating power consumption by a device employing the system 200 can facilitate reducing heat dissipation, permitting greater device density and reducing the amount of space required to vent a chip to keep it from overheating.

Moreover, the system 200 can determine an appropriate refresh time despite removal of power from the array (e.g., by monitoring changes in cell resistance due to ion movement that occurs within the tracking and/or core cells regardless of whether power is applied to the array). For example, upon reapplying power to the array, a read circuit can assess tracking cell status and can refresh the array associated with the tracking cell upon power-up if the status of the tracking cell indicates that refresh is desirable. Such is performed by setting the initial resistance state of the tracking memory cell at a resistance value higher than the programmed resistance value of core memory cells (or an upper limit of a range of resistance thereof) in the array. The tracking cell can be designed to mimic core cell resistance characteristics, such that the resistance of the tracking cell will increase with time at a rate similar to the rate of increase of core memory cells, regardless of whether power is applied to the array. A single tracking cell can be assigned to, and/or constructed in, each page of data cells (e.g., a wordline in the memory array can be devoted to tracking memory cell status), such that when the data page is read, tracking cell status is assessed prior to reading the core cells. If the tracking cell resistance is determined to exceed a predetermined acceptable reference value, then the entire array can be refreshed. Refreshing can comprise resetting all cells in the array to their original resistance levels. For instance, programmed core memory cells can be reset to their initial, relatively low resistance values, the tracking cell can be reset to its higher initial resistance value, and, if desired, erased, or unprogrammed, core memory cells can be reset to their initial resistance values, which are substantially higher than the predetermined reference threshold value that triggers a refresh when exceeded by the resistance value of the tracking cell.

The control component 202 comprises a processor 208 that facilitates analyzing information received from the tracking component 204 and/or the refresh component 206. It is to be understood that the processor 208 can be a processor dedicated to facilitating memory device refresh, a processor used to control one or more of the components of the system 200, or, alternatively, a processor that is both used to facilitate memory device refresh and to control one or more of the components of the system 200.

The control component 202 further comprises a memory 210 that can retain information associated with, for example, monitored tracking memory cell(s), core memory cell(s), and/or resistance values associated therewith, refresh schedules, time elapsed since last refresh, etc. Furthermore, the memory 210 can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 210 of the present systems and methods is intended to comprise, without being limited to, these and any other suitable types of memory.

Figure 3:
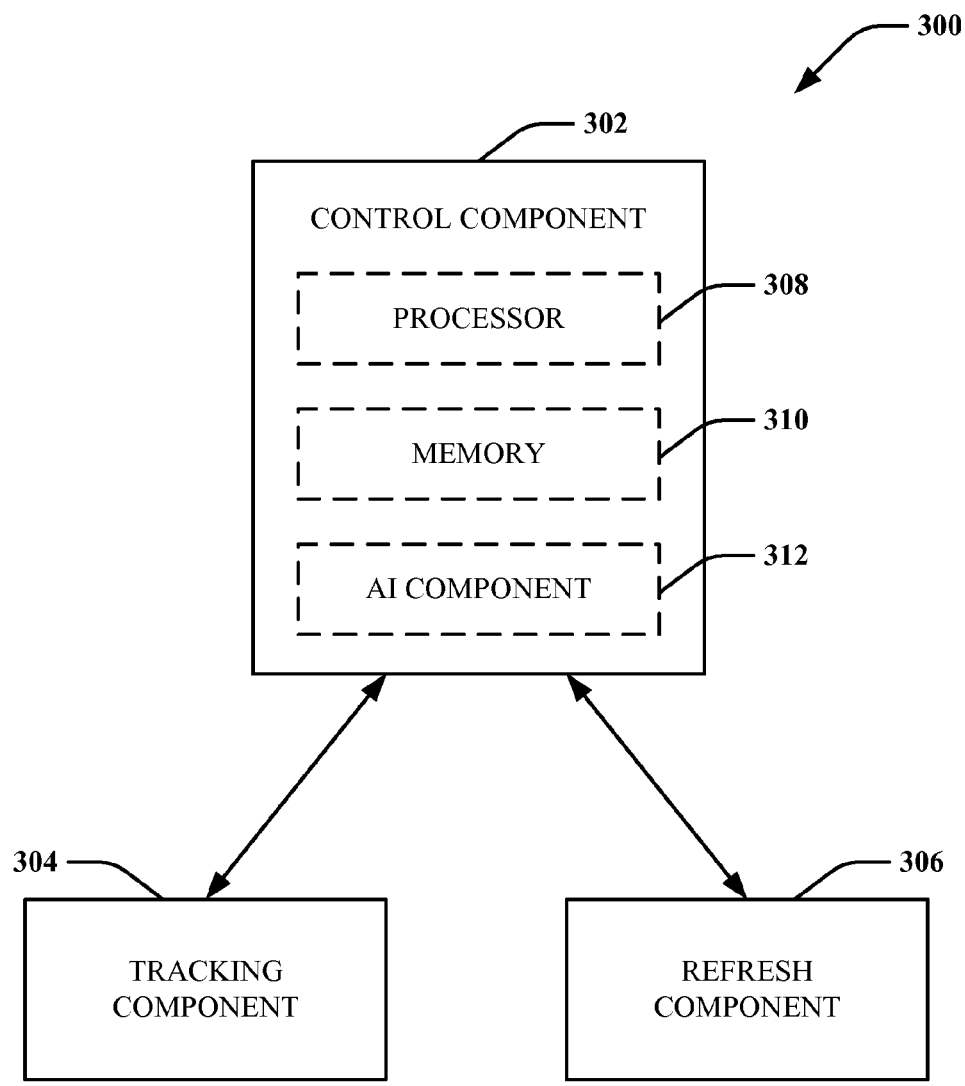
FIG. 3 is an illustration of a system 300 that facilitates determining refresh of a memory cell array in accordance with an aspect of the subject invention.

FIG. 3 is an illustration of a system 300 that facilitates determining refresh of a memory cell array in accordance with an aspect of the subject invention. The system 300 can employ various inference schemes and/or techniques in connection with determining an appropriate time for memory refresh in order to mitigate data loss. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g. support vector machines, neural networks, expert systems, Bayesian belief networks, fuzzy logic, data fusion engines . . . ) can be employed in connection with performing automatic and/or inferred action in connection with the subject invention.

Still referring to FIG. 3, a system 300 is illustrated that facilitates extending a data retention period of a memory device in accordance with an aspect of the present invention. A control component 302 is operatively coupled to a tracking component 304 that gleans information related to resistance levels in a memory array and a refresh component 306 that selectively refreshes the memory array based at least in part on information gleaned by the tracking component 304. The control component 302 comprises a processor 308 that can analyze information received from the tracking component 304, and a memory 310 that can store information related thereto. The control component further comprises an artificial intelligence (AI) component 312 that can make inferences regarding, for example, whether data stored in programmed core memory cells is intact or has been lost, corrupted, or otherwise compromised, based at least in part on information related to the resistance of the tracking cell and/or whether such resistance exceeds the threshold resistance value, to what extent the tracking cell resistance exceeds the threshold value, etc. Such inferences can be employed by the control component 302 and/or processor 308 to determine a most suitable time for refreshing the memory array in order to facilitate maintenance of data therein. Analysis of information received from the tracking component 304 and/or inferences made by the AI component 312 can warrant a decision by the control component 302 to refresh the memory cell array accordingly. Upon such a decision, the control component 302 can direct the refresh component 306 to refresh the memory cell array.

Figure 4:
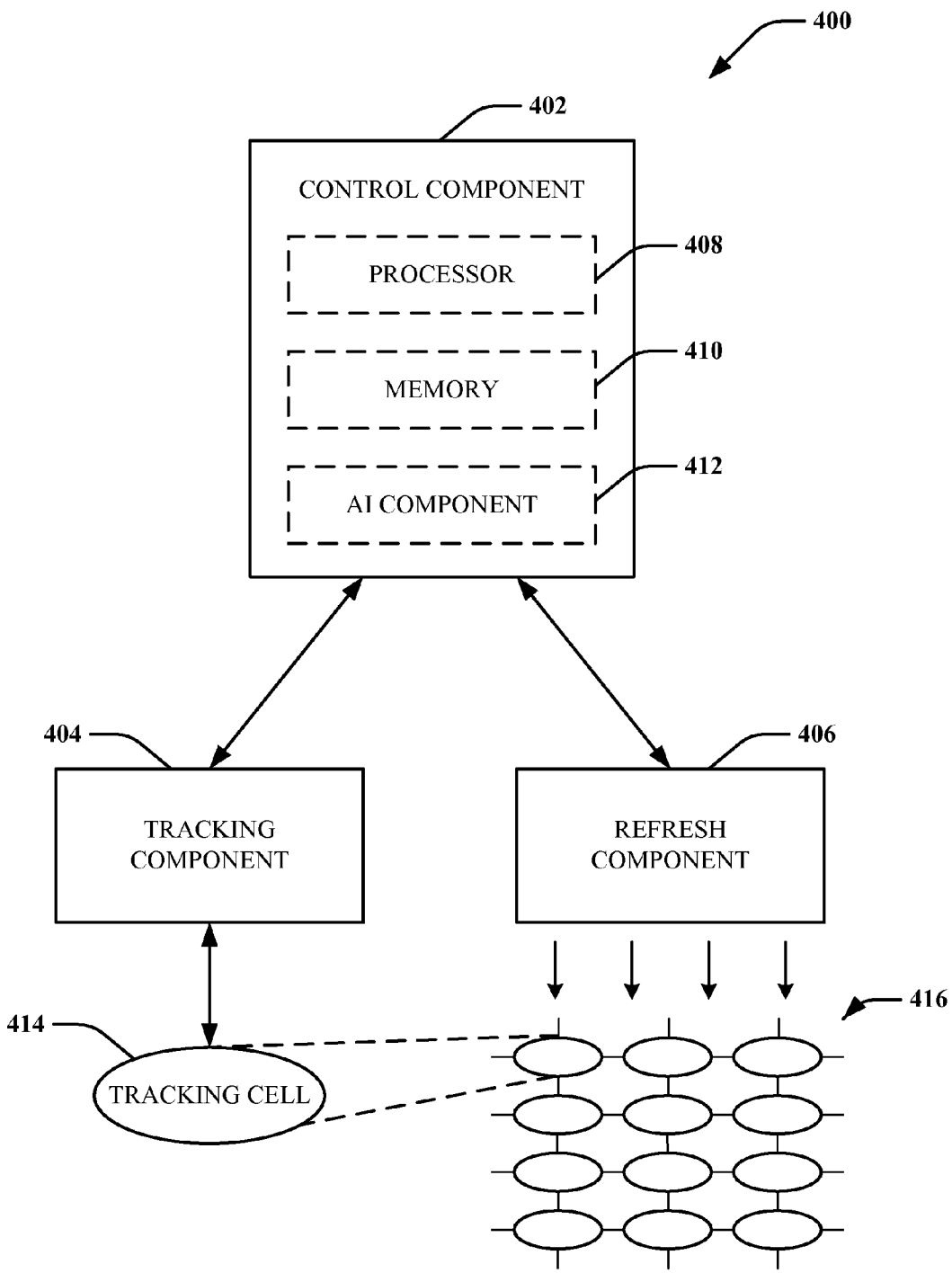
FIG. 4 is an illustration of a system 400 that facilitates extending retention time via assessing resistance in a tracking memory cell in a memory array in accordance with an aspect of the subject invention.

FIG. 4 is an illustration of a system 400 that facilitates assessing resistance in a tracking memory cell in a memory array in accordance with an aspect of the subject invention. A control component 402 is operatively coupled to a tracking component 404 and a refresh component 406. The control component 402 comprises a processor 408 that analyzes information received from the tracking component 404, a memory 410 that can store information related to status information received from the tracking component 404 and/or analyzed by the processor 408, and an AI component 412 that can make inferences regarding the status of a tracking memory cell, an array associated therewith, etc.

The tracking component 404 monitors at least one memory cell, or "tracking" cell 414, in an array 416. The tracking cell 414 can be assessed during a power-up phase and/or periodically during a continuous power-up phase. It is to be appreciated that the tracking cell can be continuously monitored during a continuous power-up phase if desired. The control component 402 can analyze information received from the tracking component 404 regarding the status of the tracking cell 414. Such information can comprise, for example, a resistance level associated with the tracking cell. The tracking cell 414 will continue to experience ion movement (e.g., copper ion migration between layers) when power is removed from the array 416 in which the tracking cell 414 is located. When power is reapplied to the array 416, the tracking cell 414 can be assessed by the tracking component 404 and a determination of the resistance of the tracking cell 414 can be made. Tracking cell resistance at power-up can then be compared to a reference value, and, if in excess of the reference value, the control component 402 can direct the refresh component 406 to refresh the array 416 by resetting resistance values of cells therein to original levels. Such can be achieved, for example, via application of specific voltages to the various respective wordlines and bitlines associated with individual cells in the array 416. In this manner, the system 400 can facilitate extension of a data retention period associated with the particular memory array for which the system 400 is employed.

Figure 5:
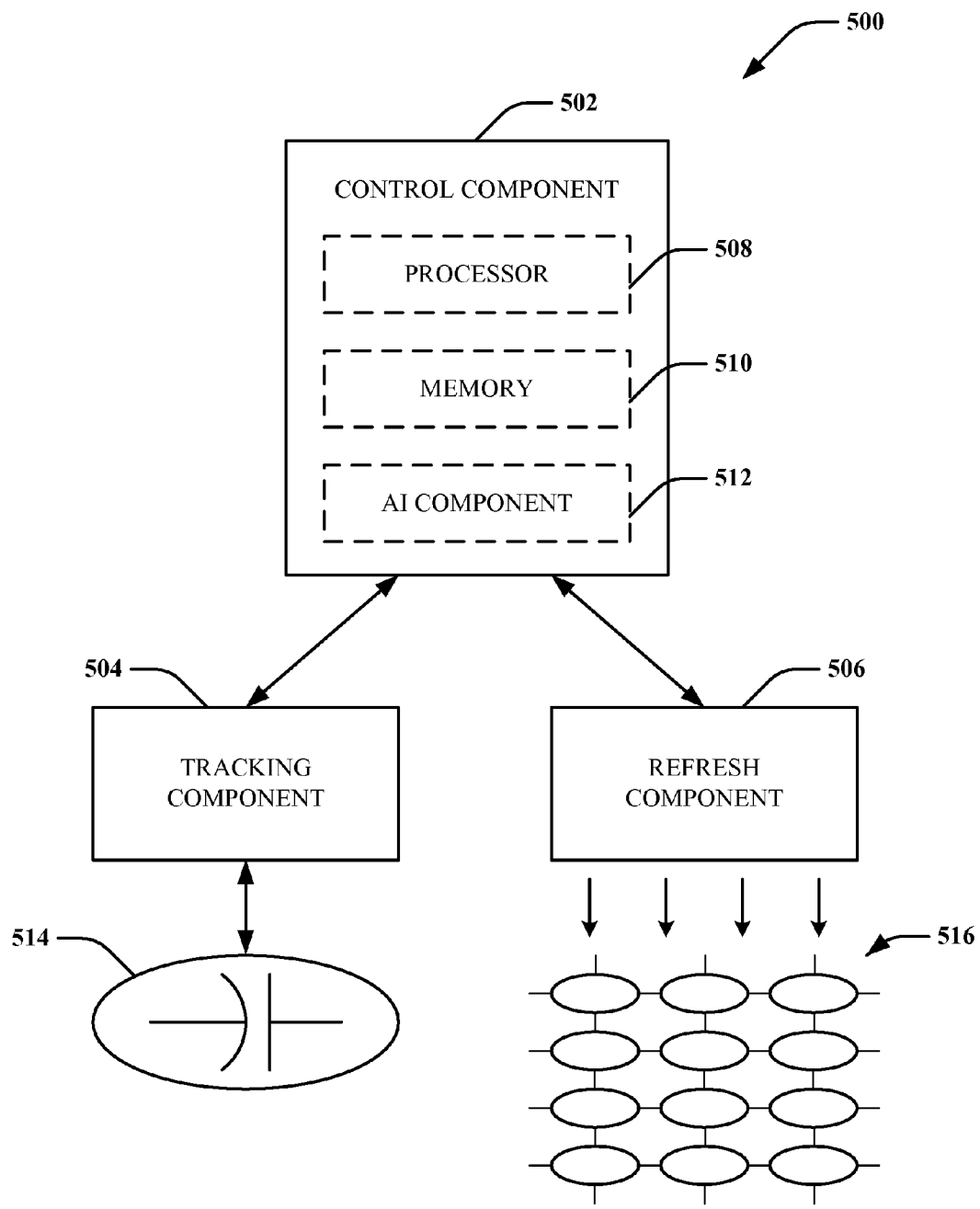
FIG. 5 is an illustration of a system 500 that facilitates enhancing data retention in a memory device via monitoring a corresponding capacitor structure in accordance with an aspect of the subject invention

FIG. 5 is an illustration of a system 500 that facilitates enhancing data retention in a memory device in accordance with an aspect of the subject invention. A control component 502 is operatively associated with each of a tracking component 504 and a refresh component 506. The control component 502 comprises a processor 508 that analyzes information received from the tracking component 504, a memory 510 that can store information related to status information received from the tracking component 504 and/or analyzed by the processor 508, and an AI component 512 that can make inferences regarding the status of a memory cell array.

The tracking component can monitor the status of a capacitor structure 514. For example, the capacitor structure 514 can be comprised of materials similar to those used in construction of, for example, memory cells in a memory cell array 516. In this manner, the electrical properties of the capacitor structure 514 will simulate and/or represent the electrical properties of cells in the memory array 516 with regard to, for instance, resistance, impedance, charge retention, voltage dissipation, etc. The capacitor structure 514 can be monitored by the tracking component 504 to glean information related to the status of the capacitor structure 514. For example, charge on and/or voltage across the capacitor structure 514 can be monitored and employed to determine a total impedance of the capacitor structure 514, and information related thereto can be received by the control component 502 and analyzed in conjunction with a reference impedance, resistance, charge, voltage, etc. The control component 502 can make a determination with regard to whether the memory cell array 516 should be refreshed based on whether the impedance status of the capacitor structure 514 is at or above a threshold status value. If such a determination is made, the control component 502 can direct the refresh component 506 to refresh the entire memory cell array 516 in order to maintain data stored therein and preempt data loss and/or corruption.

Figure 6:
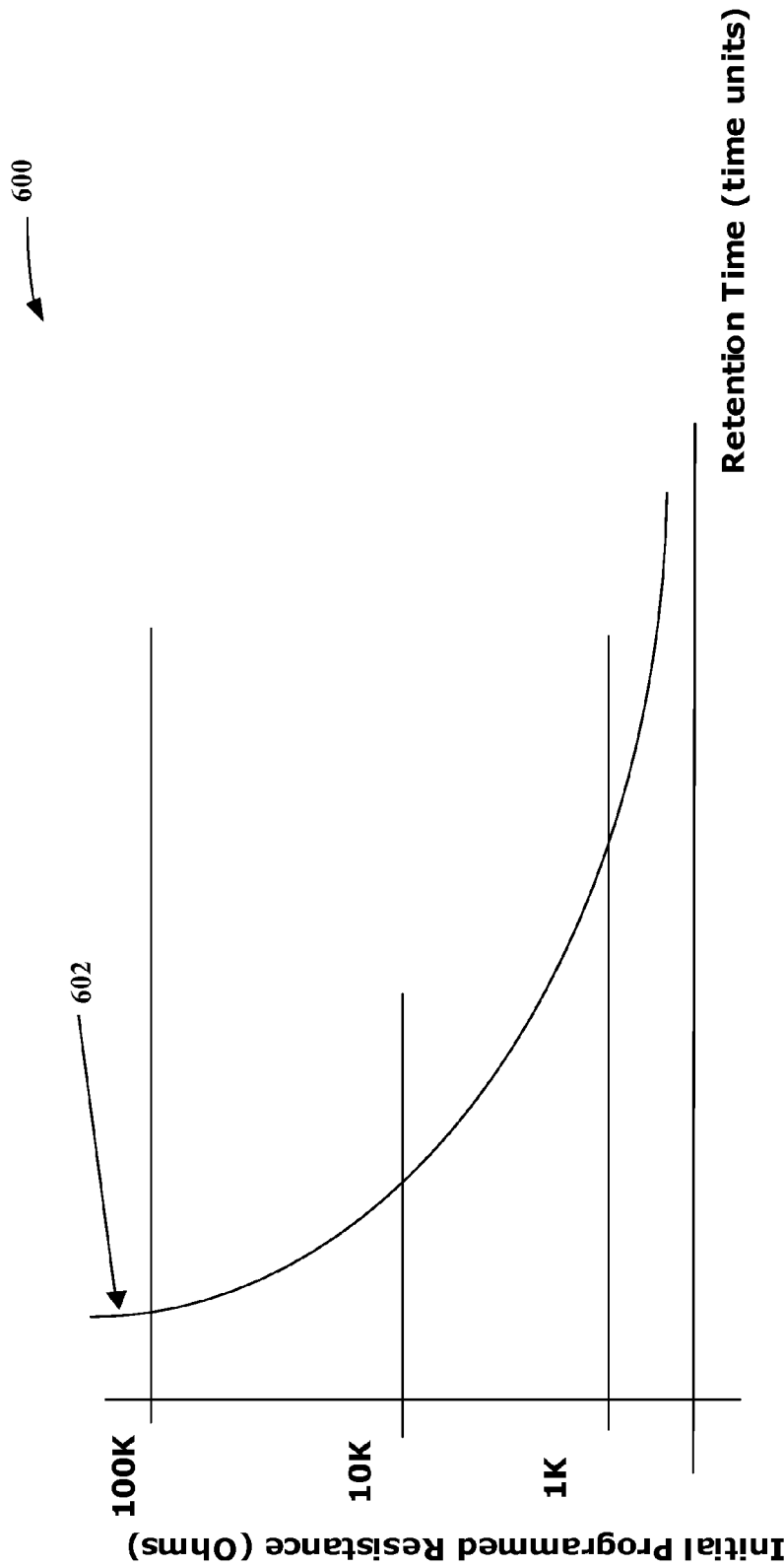
FIG. 6 is an illustration of a graphical representation 600 of a relationship between data retention and initial memory cell resistance, in accordance with an aspect of the subject invention.

FIG. 6 is an illustration of a graphical representation 600 of a relationship between data retention and initial memory cell resistance, in accordance with an aspect of the subject invention. As illustrated, higher initial resistance in a memory cell correlates to lower retention time, which correlation is presented by the curve 602. The subject invention mitigates the relatively short retention time associated with memory cells having high initial resistance by tracking a ion motion in the reference cell (e.g., and the effect thereof on cell resistance) and refreshing an array in which the reference cell is located before core memory cells in the array reach a critical level at which data loss and/or corruption can occur.

Figure 7:
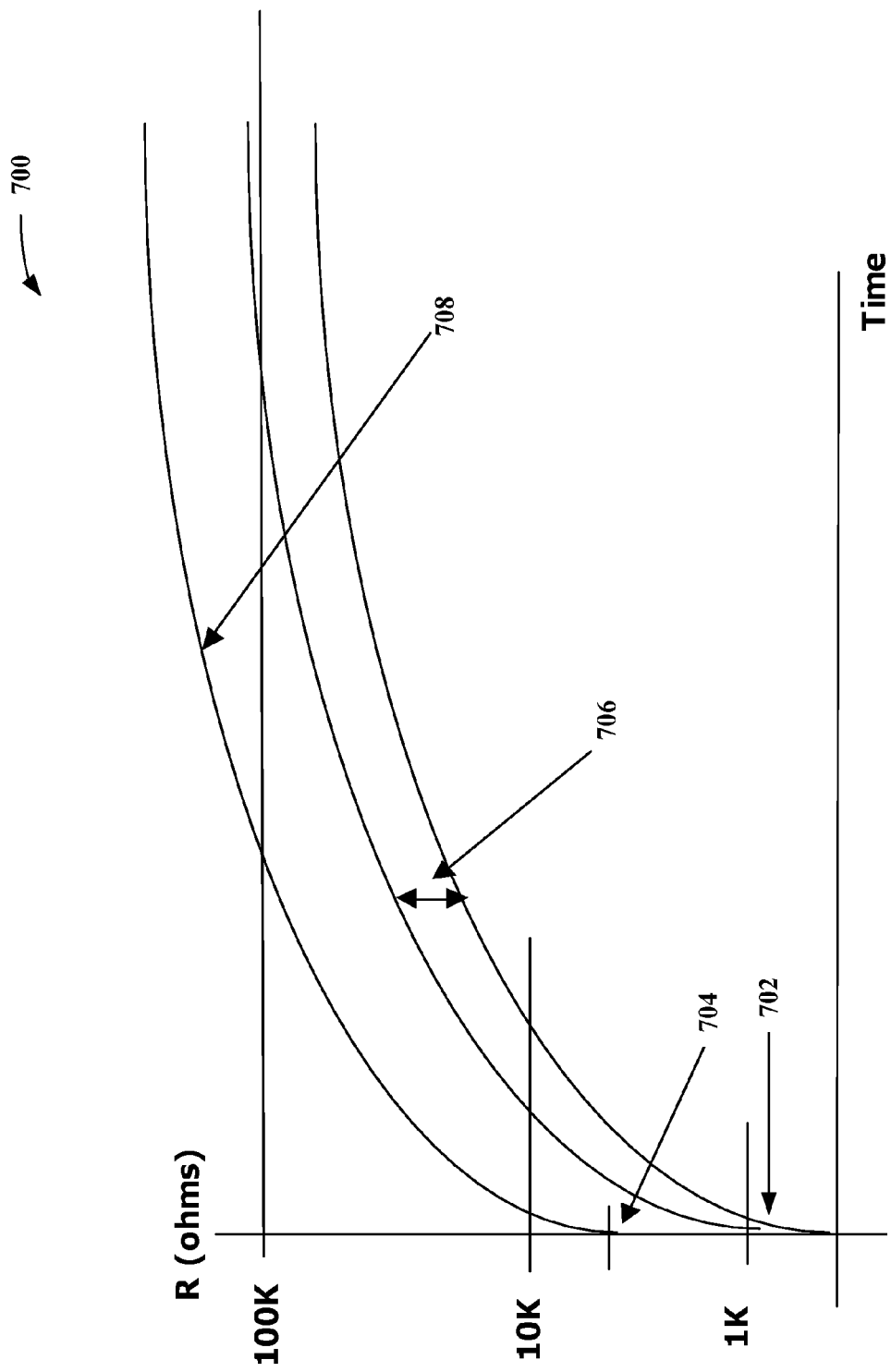
FIG. 7 illustrates a graphical representation of resistance curves that describe exemplary programmed cell resistance and reference cell resistance with respect to time in accordance with an aspect of the subject invention.

FIG. 7 illustrates a graphical representation of resistance curves that describe exemplary programmed cell resistance and reference cell resistance with respect to time in accordance with an aspect of the subject invention. Initial resistance for programmed cells 702 can be, for instance, below 1 k$\Omega$. Initial resistance for a reference tracking cell 704 can be preset substantially above the initial resistance of the programmed cells, such that the resistance of the tracking cell 704 follows a path 708 similar to that of the core programmed cells while maintaining a magnitude substantially larger than the upper limit of programmed cell resistance at any given time. The range of programmed cell resistance is illustrated at 706, which range is bounded by upper and lower limit curves. It is to be appreciated that the specific resistance values presented with respect to FIG. 7, and other figures, is exemplary in nature and is not intended to limit the scope of the subject invention. Rather, memory cells of various types can operate in different resistance ranges, and the subject invention can be employed and/or tuned to facilitate data retention extension by arrays of such memory cell types. Moreover, the resistance value to which a tracking cell is initially set can be any suitable value greater than the initial upper limit resistance value for memory cells in an array, and can be fine-tuned to more closely resemble the core memory cell resistance path in order to further mitigate unnecessary refresh of the memory array.

Figure 8:
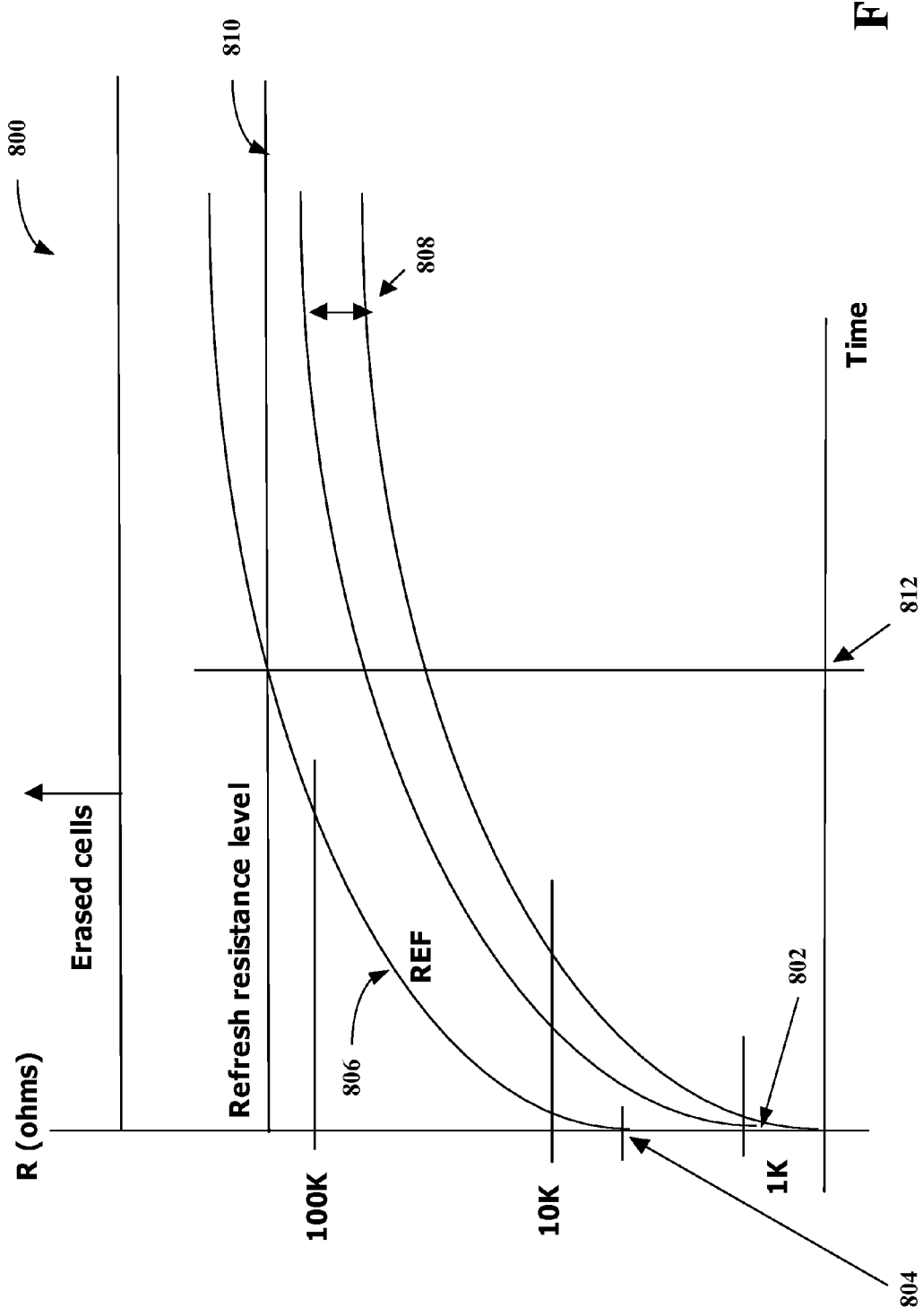
FIG. 8 is a graphical representation 800 of resistance paths that facilitate determination of a refresh time for a memory array in which a tracking cell is located, in accordance with an aspect of the subject invention.

FIG. 8 is a graphical representation 800 of resistance paths that facilitate determination of a refresh time for a memory array in which a tracking cell is located, in accordance with an aspect of the subject invention. Initial resistance and/or ranges thereof can be determined and are illustrated at 802, while range of programmed cell resistance with respect to time is illustrated at 808. An initial tracking cell resistance level 804 can be set above the resistance level for the programmed core memory cells 802 so that the reference cell resistance signature 806 mimics the core memory cell(s) resistance signature 808 and/or an upper boundary thereof while maintaining a substantially higher magnitude profile. A refresh threshold resistance level 810 can be predetermined and set, such that the reference tracking cell resistance will reach a magnitude equal thereto prior to the core memory cell(s). Refresh time 812 can be defined as the time at which the magnitude of the reference cell resistance 806 equals or exceeds the reference threshold resistance level 810, and can trigger a refresh of the entire memory array.

As illustrated, the refresh threshold resistance level 810 is selected to ensure that the reference cell resistance 806 will trigger a refresh well before an upper boundary of the programmed memory cell resistance range reaches the reference level, let alone any critical resistance level at which the memory cell(s) might be compromised (e.g., data loss and/or corruption). It will be noted that unprogrammed, or erased, memory cells are preset to a resistance level far in excess of either the programmed memory cells or the reference cell, and resistance of a cell increases with ion migration over time, such that erased memory cell resistance will increase in a direction away from the reference threshold resistance level and will not affect refresh triggering. Refresh of the memory array can comprise resetting all memory cells in the array to original resistance levels, which is described in further detail with regard to FIG. 9, infra.

Figure 9:
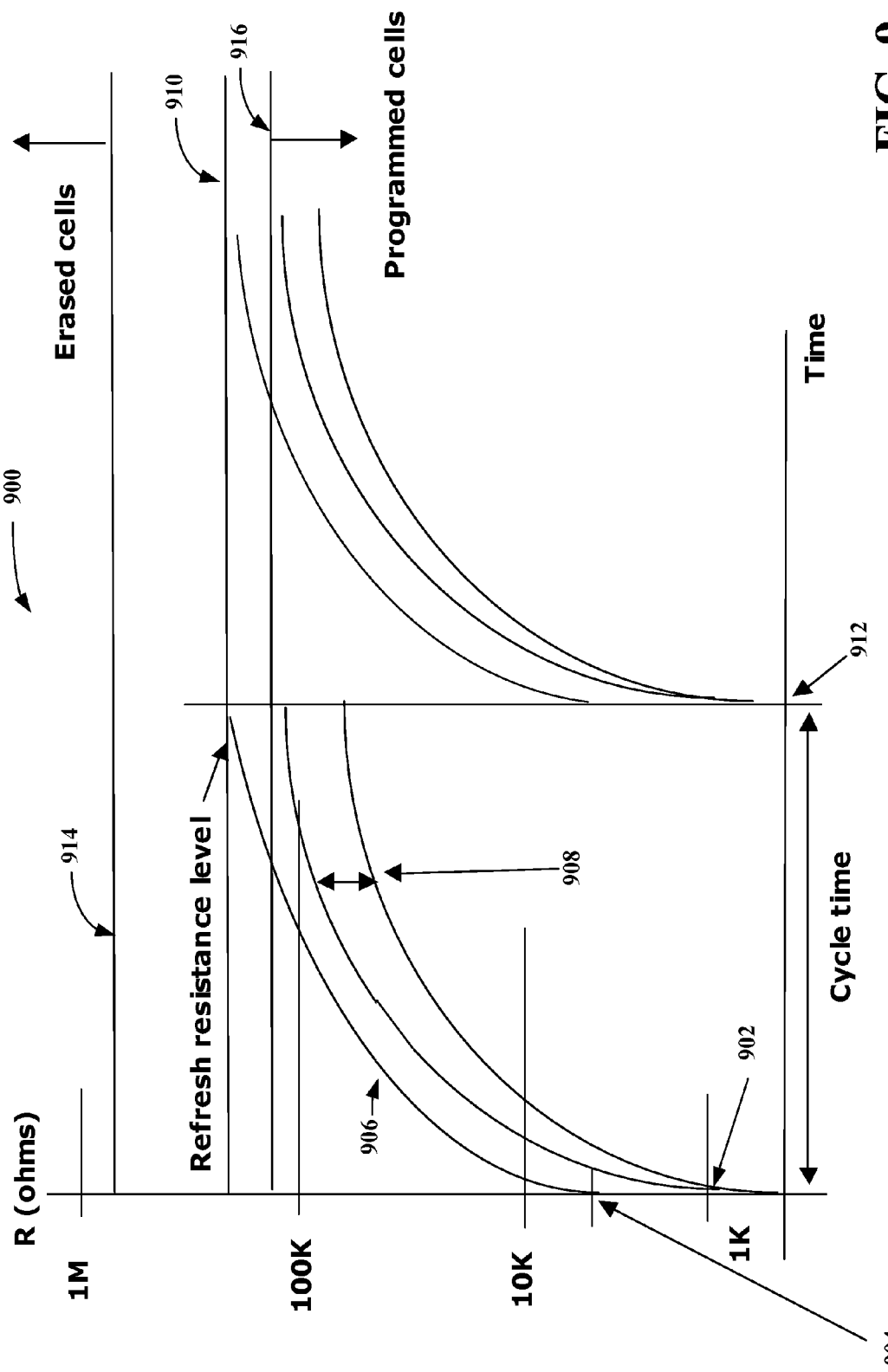
FIG. 9 is a graphical illustration 900 of resistance characteristics that can be employed to facilitate a determination of an appropriate refresh time for a memory array in which a tracking cell is located, in accordance with an aspect of the subject invention.

FIG. 9 is a graphical illustration 900 of resistance characteristics that can be employed to facilitate a determination of an appropriate refresh time for a memory array in which a tracking cell is located, in accordance with an aspect of the subject invention. Initial core memory cell resistance value(s) 902 are illustrated in the range of 1 k$\Omega$, which range is offered for illustrative purposes and is not intended to be interpreted in a limiting sense. A reference tracking cell initial resistance 904 can be set to a value above the initial core memory cell resistance 902 and can exhibit a resistance profile 906 that increases over time in a manner that mirrors the core cell resistance profile 908. A threshold resistance value 910 can be determined and set such that when the resistance of the tracking cell 906 meets or exceeds the threshold level 910, a refresh of all memory cells (e.g., tracking and core memory cells) will be triggered. The time at which the refresh is triggered is illustrated at 912, at which point all programmed core cell resistances are returned to the original resistance value 902. As described with reference to FIG. 8, erased and/or unprogrammed cells can have an initial resistance value 914 that is substantially larger than the resistance level of programmed core cells and/or the reference cell. A programmed core cell maximum acceptable resistance threshold level 916 can be defined near the reference cell resistance threshold level 910 to ensure that the reference cell resistance triggers a refresh before programmed core cell resistance increases to a point at which data can be compromised. In this manner, the systems described herein can refresh a memory array as necessary without initiating superfluous refresh actions that can waste system power and/or resources. Additionally, assessment of the tracking cell resistance level can be performed periodically during a power-on period and/or upon application of power to the memory array after a power-off period to determine wither refresh is necessary because the resistance of the tracking cell will continue to increase due to ion movement despite withdrawal of a power source.

Figure 10:
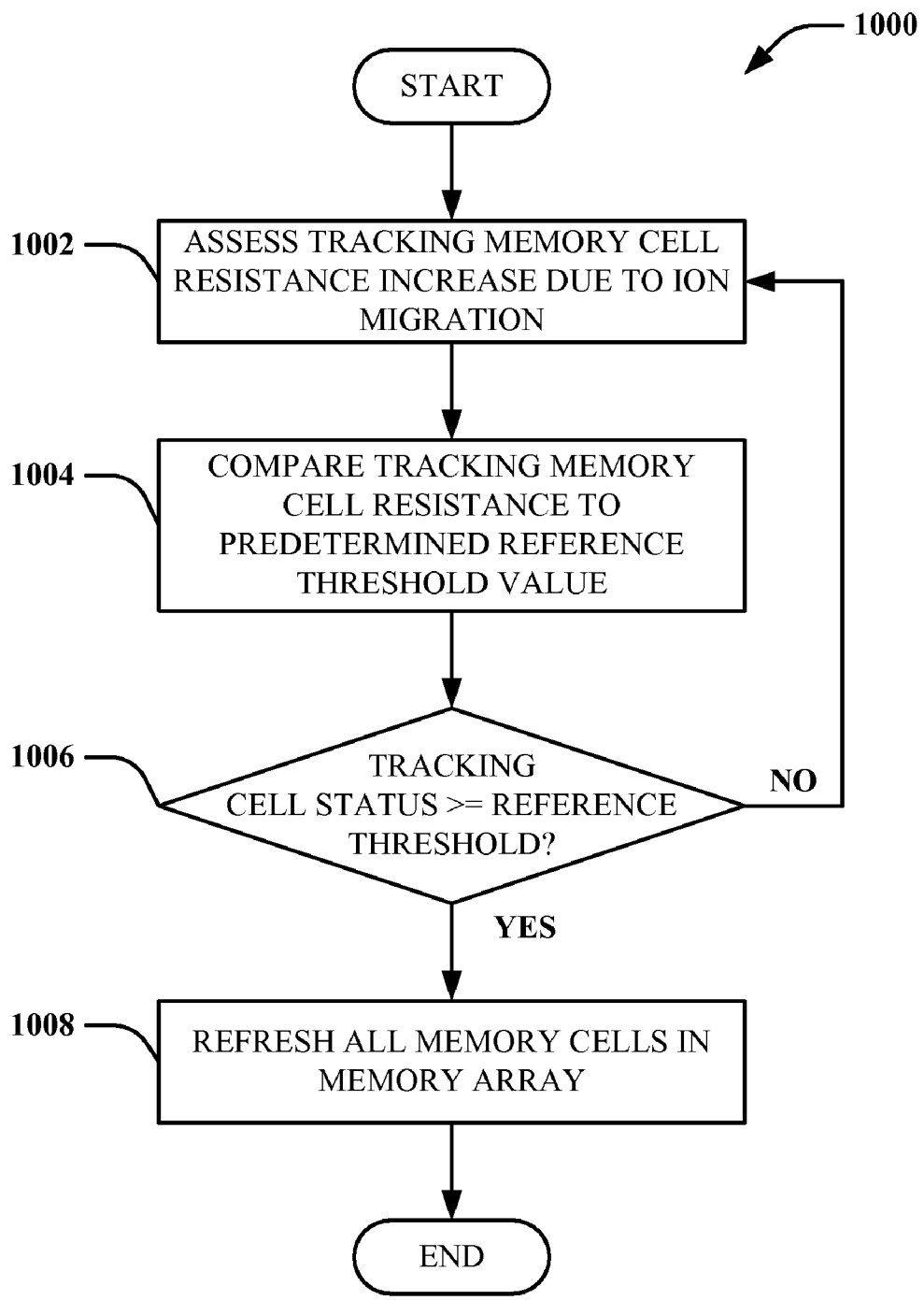
FIG. 10 is an illustration of a methodology 1000 for extending polymer memory data retention a memory cell array in accordance with an aspect of the subject invention.
Figure 11:
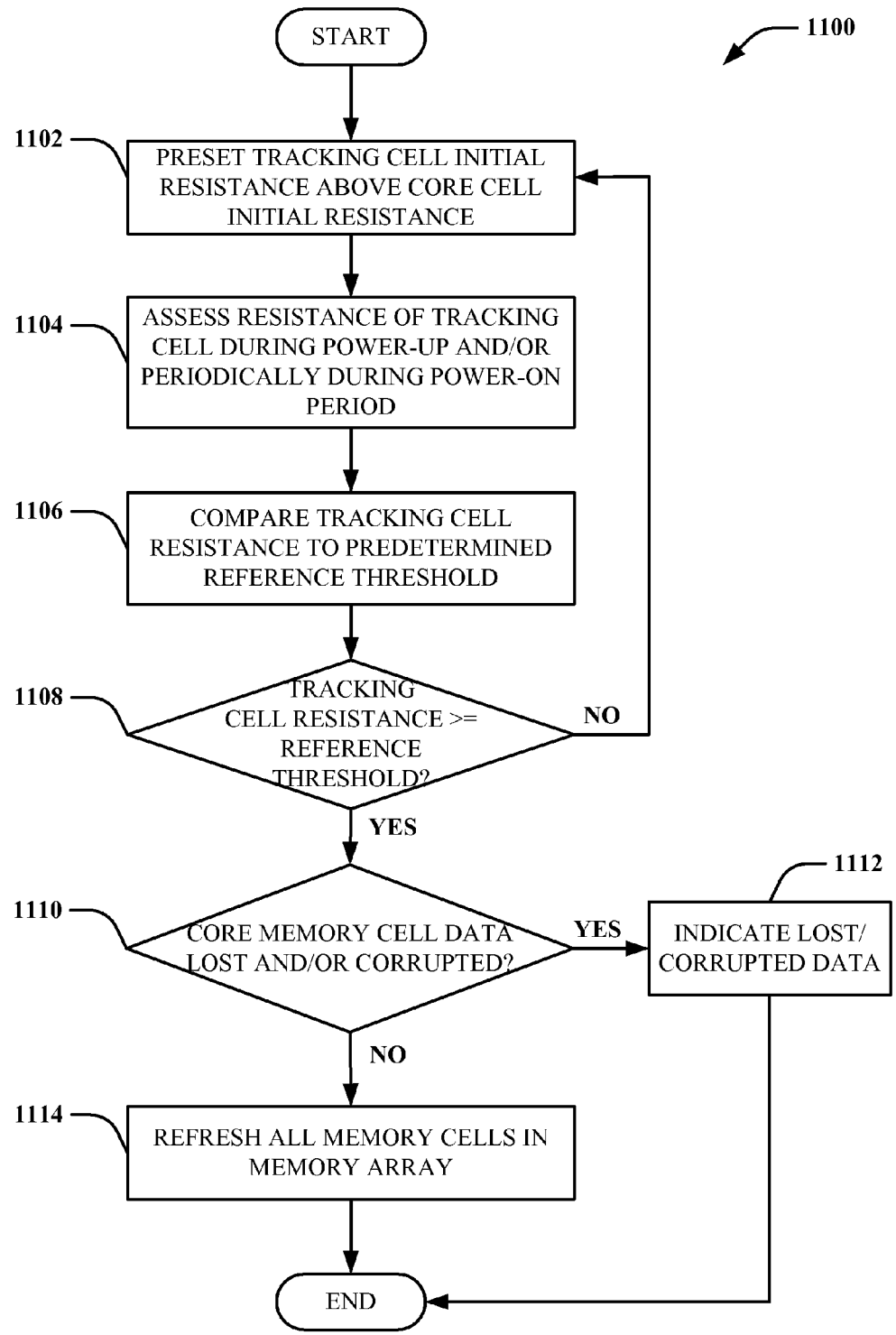
FIG. 11 is an illustration of a methodology 1100 for extending data retention in a medium-retention memory array, such as an NRM array, in accordance with an aspect of the subject invention.

Turning briefly to FIGS. 10 and 11, methodologies that can be implemented in accordance with the present invention are illustrated. While, for purposes of simplicity of explanation, the methodologies are shown and described as a series of blocks, it is to be understood and appreciated that the present invention is not limited by the order of the blocks, as some blocks can, in accordance with the present invention, occur in different orders and/or concurrently with other blocks from that shown and described herein. Moreover, not all illustrated blocks may be required to implement the methodologies in accordance with the present invention.

FIG. 10 is an illustration of a methodology 1000 for extending polymer memory data retention a memory cell array in accordance with an aspect of the subject invention. According to an example, the method can facilitate refreshing a memory cell array, such as an NRM array, when refreshing is needed to prevent data loss/corruption. Traditional memory refresh systems refresh memory arrays on a predetermined schedule that is often defined by known attributes of a memory cell. For instance, if it is known that a particular type of memory requires refreshing every 10 minutes, then a conventional system can pre-schedule memory refreshes every 9 minutes to prevent data loss. However, if the memory array does not require refreshing at the prescheduled time, then system resources (e.g., time, power . . . ) can be wasted during the unnecessary refresh of the array. The method 1000 mitigates a need for periodic refresh that is bound by a schedule, thus improving device efficiency and reducing operating costs by facilitating operating a memory chip at a lowest possible level of power consumption. Furthermore, mitigating power consumption by a device employing the method 1000 can facilitate reducing heat dissipation, permitting greater device density, and reducing the amount of space required to vent a chip to keep it from overheating.

Moreover, the method 1000 can determine an appropriate refresh time despite removal of power from the array (e.g., by assessing resistance changes due to ion movement that occurs within the tracking and/or core cells with or without power applied to the array). For example, upon reapplication of power to the array, a read circuit can assess tracking cell status and can refresh the array associated with the tracking cell upon power-up if the status of the tracking cell indicates that refresh is desirable. Such is performed by setting the initial resistance state of the tracking memory cell at a resistance value higher than the programmed resistance value of core memory cells (or an upper limit of a range of resistance thereof) in the array. The tracking cell can be designed to mimic core cell resistance characteristics, such that the resistance of the tracking cell will increase with time at a rate similar to the rate of increase of core memory cells, regardless of whether power is applied to the array. A single tracking cell can be assigned to, and/or constructed in, each page of data cells (e.g., a wordline in the memory array can be devoted to tracking memory cell status), such that when the data page is read, tracking cell status is assessed prior to reading the core cells. If the tracking cell resistance is in excess of a predetermined acceptable reference value, then the entire array can be refreshed. Refreshing can comprise resetting all cells in the array to their original resistance levels. For instance, programmed core memory cells can be reset to their initial, relatively low resistance values, the tracking cell can be reset to its higher initial resistance value, and, if desired, erased, or unprogrammed, core memory cells can be reset to their initial resistance values, which are substantially higher than the predetermined reference threshold value that triggers a refresh when exceeded by the resistance value of the tracking cell.

Now referring to the method 1000, at 1002 a reference memory tracking cell in an array of memory cells can be assessed to determine a resistance value thereof. Assessment can be performed via a simple read circuit, and can occur continuously and/or periodically during a period in which power is applied to the memory cell array. Additionally, tracking cell assessment can be performed during a power-up phase after a period in which power has been removed from the array. Resistance in the tracking cell and core memory cells alike will continue to increase during periods of no power due to ion (e.g., copper ions, . . . ) migration in the cells. The method 1000 advantageously employs this characteristic of NRM cells to facilitate a determination of an appropriate time for memory refresh without performing superfluous refreshes, which can waste power and system resources.

At 1004, the tracking cell resistance can be compared to a preset reference threshold resistance value, which is set substantially above the highest acceptable resistance value for a programmed core memory cell. The tracking cell can be designed to exhibit resistance characteristics that ensure that the resistance of the tracking cell will reach the preset reference threshold before core programmed memory cell resistance increases to a point at which data can be compromised (e.g. lost or corrupted). Then, at 1006, a determination can be made regarding whether the resistance of the tracking cell has exceeded the reference value. If tracking cell resistance is below the reference threshold, then the methodology can revert to 1002 for another iteration of tracking cell assessment, etc. If, it is determined at 1006 that tracking cell resistance is in excess of the preset threshold value, then a refresh of all cells (e.g., programmed, unprogrammed, and the tracking cell) in the array is triggered at 1008, whereby all cells in the array are reset to their original initial resistance values.

FIG. 11 is an illustration of a methodology 1100 for extending data retention in a medium-retention memory array, such as an NRM array, in accordance with an aspect of the subject invention. At 1102, an initial resistance value for a tracking reference cell in a memory cell array can be preset. Presetting the value can comprise, for example, constructing the tracking cell of materials similar or identical to those utilized to construct core memory cells in the array while altering components thereof to increase a base resistance of the tracking cell, etc., and/or determining a base resistance value for a tracking cell that has been constructed in such a manner, etc. At 1104, the tracking cell resistance can be assessed to determine an increase in the value thereof due to copper ion migration in the cell over time. The assessment can be performed at power-up after a period in which no power has been applied to the array, periodically during a period in which power is applied to the array, and/or continuously during a power-on period.

A comparison of tracking cell resistance to a predetermined threshold resistance value can be made at 1106. At 1108, a determination can be made regarding whether the resistance of the tracking cell has exceeded the predetermined threshold value during a power-off period, between periodic assessments of the tracking cell, etc. If it is determined that the tracking cell resistance level is below the threshold value, then the method can revert to 1102 for further iterations of the methodology. If the determination at 1108 indicates that the tracking cell resistance has met or exceeded the threshold resistance value, then the method can proceed to 1110, where further determination(s) are made regarding whether data stored in programmed memory cells has been compromised, lost, and/or corrupted. Such determination can be made, for example by comparison of tracking cell resistance to a predefined lookup table of values at which data loss, data corruption, degrees thereof, etc., occurs. Additionally and/or alternatively, inferences can be made regarding the magnitude of the increase of resistance in the tracking cell and a potential for compromised data in programmed core cells based at least in part on tracking cell resistance magnitude, etc.

If the determination at 1110 indicates that the data stored in one or more programmable cells has been lost or corrupted due to, for example, too long a period without power, and indication of such can be presented to, for instance, a user. If it is determined that programmed memory cells have not been adversely affected despite the breach of the threshold resistance value by the tracking cell, then all memory cells in the array can be refreshed via resetting resistance values there for to initial resistances.

What has been described above includes examples of the present invention. It is, of course, not possible to describe every conceivable combination of components or methodologies for purposes of describing the present invention, but one of ordinary skill in the art can recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system that extends data retention duration in a memory cell array, comprising:
    a tracking component that assesses resistance in a tracking element associated with the memory cell array;
    a control component that compares the resistance of the tracking element to a reference value to determine whether refresh of the memory cell array is desirable; and
    a refresh component that refreshes the memory cell array when the resistance of the tracking element increases to greater than or equal to the reference value.

2. The system of claim 1, the tracking element is a reference memory cell in the memory array with an initial resistance value greater than the initial resistance value for programmed core memory cells in the array.

3. The system of claim 2, the tracking component assess increased resistance in the tracking element due to ion migration in the tracking element, the ion migration occurs regardless of whether power is applied to the tracking cell and/or the memory array.

4. The system of claim 1, the tracking element is constructed as a memory cell in the array, the array comprising a page of memory cells.

5. The system of claim 1, the memory cell array is a nanoscale resistive memory array.

6. A method for extending data retention time in a memory device, comprising:
    assessing resistance in a tracking element associated with a memory cell array in the memory device;
    comparing the resistance of the tracking element with a predetermined reference resistance value to determine whether the array should be refreshed to mitigate data loss and/or corruption; and
    refreshing the memory array if the resistance of the tracking element increases to greater than or equal to the predetermined reference value.

7. The method of claim 6, further comprising setting the predetermined reference resistance value to be exceeded by the tracking element to trigger refresh of the array at a time before resistance in core programmed memory cells exceeds a level at which data stored therein can be compromised.

8. The method of claim 6, assessing resistance in the tracking element occurs periodically during a period in which power is applied to the memory cell array.

9. The method of claim 6, resistance in the tracking element is continuously assessed during a period in which power is applied to the memory cell array.

10. The method of claim 6, resistance in the tracking element is assessed during power-up of the memory cell array after a period during which power is not applied to the memory cell array.

11. The method of claim 10, resistance change in the tracking element with respect to time due to ion migration in the tracking element is assessed to determine whether the resistance of the tracking element is in excess of the predetermined reference resistance value.

12. The method of claim 6, further comprising assessing resistance in the tracking element at the beginning of a read of the memory cell array.

13. The method of claim 6, the tracking element is a reference memory cell in the memory cell array.

14. The method of claim 13, further comprising setting the initial resistance of the reference memory cell to a higher resistance value than the resistance of programmed memory cells in the memory cell array.

15. The method of claim 6, further comprising determining whether data stored in the memory cell array has been compromised due to extensive power deprivation by predefining a resistance value at which data loss/corruption is known to occur and comparing the resistance of the tracking element to the resistance value at which data loss/corruption is known to occur.

16. The method of claim 15, further comprising providing an indication of compromised data to a user if the resistance value of the tracking element is greater than or equal to the resistance value at which data loss/corruption is known to occur.

17. The method of claim 6, further comprising constructing the tracking element in the memory cell array such that a tracking element is provided for each page of memory cells in the memory device and each page of memory cells is refreshed when the resistance of its tracking cell is determined to meet or exceed the predetermined reference resistance value.

18. The method of claim 6, the memory cell array is a nanoscale resistive memory array.

19. A system that facilitates extending data retention time in a memory device, comprising:
    means for assessing resistance in a reference memory cell in a nanoscale resistive memory cell array;
    means for comparing the resistance of the reference memory cell to a predetermined threshold value; and
    means for refreshing the memory cell array if the resistance of the reference memory cell increases to equal to or greater than the predetermined threshold value to mitigate data loss and/or corruption.

20. The system of claim 19, the means for assessing resistance performs an assessment of the resistance of the reference memory cell at least one of: periodically during a power-on period; continuously during a power-on period; and during a power-up period when power is applied or reapplied to the memory cell array after a period without power.

* * * * *